Oct. 10, 1972 M. F. LAMORTE 3,697,336

METHOD OF MAKING SEMICONDUCTOR DEVICES

Filed May 2, 1966 2 Sheets-Sheet 1

INVENTOR
MICHAEL F. LAMORTE
BY Glenn H. Bruestle
Attorney

INVENTOR.
MICHAEL F. LAMORTE
BY Glenn H. Bruestle
Attorney 3,697,336
METHOD OF MAKING SEMICONDUCTOR DEVICES Michael F. Lamorte, Princeton, N.J., assignor to RCA Corporation, New York, N.Y.

Filed May 2, 1966, Ser. No. 546,814
Int. Cl. H01l 7/00
U.S. Cl. 148—171 7 Claims

ABSTRACT OF THE DISCLOSURE

A laser diode is made by forming on a first layer of a semiconductor material a second layer of a semiconductor material. Masking strips of silicon dioxide are provided in spaced relation on the surface of the second layer leaving portions of the surface exposed. The exposed portions of the second layer are dissolved to the depth of the junction between the first and second layers using a molten mixture of Ga and GaAs. By solution regrown, a third material is deposited in place of the portions dissolved.

This invention relates generally to semiconductor devices, and more particularly to improved laser diodes and novel methods of making them. The improved semiconductor devices and methods of making them are particularly useful for providing improved laser diodes of the GaAs (gallium arsenide) type.

An important factor affecting the efficiency of operation of a laser diode is the heat produced within the diode by the threshold current needed to operate it. By the term "threshold current" is meant the minimum current needed to initiate laser action at a given temperature. Laser diodes of the GaAs type, for example, lase continuously and relatively efficiently at the temperatures of liquid nitrogen (77° K.) and lower. Cryogenic cooling of semiconductors is, however, rather cumbersome, and in some instances impractical. Boosting the threshold current to the level needed to achieve lasing at higher temperatures is self-defeating because the higher current causes the temperature of the diode to rise, and the higher the temperature of the diode the lower is its efficiency of operation. Ultimately, if the heat rises too high, the diode will be destroyed.

It is an object of the present invention to provide novel methods of making improved laser diodes that operate with relatively lower threshold currents than those required by laser diodes of the prior-art.

Another object of the present invention is to provide laser diodes that have relatively lower thermal resistances than prior-art laser diodes.

Still another object of the present invention is to provide novel methods of making improved laser diodes that are relatively more efficient and rugged than those of the prior-art.

A further object of the present invention is to provide novel methods of making improved laser diodes that have relatively narrower PN junctions than prior-art laser diodes.

Each of the improved laser diodes comprises a body of semiconductor material having an elongated PN junction between N type and P type regions. At least one of the regions forming the PN junction is elongated. An additional region of semiconductor material, having a resistivity of at least one order of magnitude greater than that of either of the regions forming the PN junction, is disposed on opposite sides of at least the elongated region to increase the strength of the laser diode and to function as a heat sink for the PN junction, whereby to reduce the thermal resistance of the laser diode and thus to increase its efficiency.

The improved laser diodes are made by novel methods wherein a junction is formed between two layers of semiconductor material. A plurality of strips of silicon dioxide are disposed on a major surface on one of the layers, exposing portions of the layer. These exposed portions are dissolved, to a death extending to at least the junction between the two layers, with a molten mixture solution comprising GaAs and Ga (gallium) as components thereof. The molten mixture is then allowed to cool to a temperature at which monocrystalline semiconductor material is regrown in the dissolved portions. The regrown semiconductor material may be either intrinsic, P type, or N type GaAs, depending on other components of the mixture.

The improved laser diodes and the novel methods of making them will be described in detail with reference to the accompanying drawings, in which.

Figure 1:
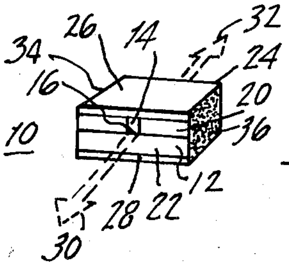
FIG. 1 is a respective view of an improved laser diode made by the operations shown in FIGS. 2–6.
Figure 2:
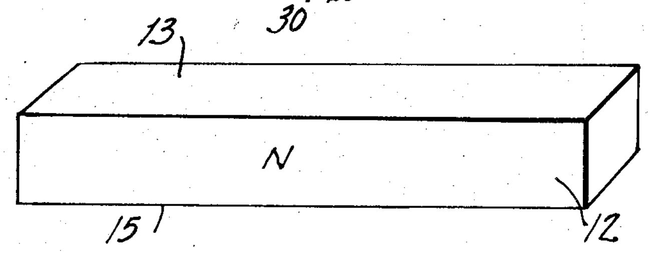
FIG. 2 is a perspective view of a layer or wafer of semiconductor material used in the methods of making the improved laser diodes.

Referring now to FIG. 1 of the drawings, there is shown one embodiment of an improved laser diode 10 made by one embodiment of the novel methods, operations of which are illustrated in FIGS. 2–6. The laser diode 10 comprises a layer 12 of semiconductor material, such as N type GaAs, and an elongated layer 14 of semiconductor material, such as P type GaAs, forming a PN junction 16 with the layer 12. Layers 20 of relatively high resistivity semiconductor material, such as intrinsic GaAs, are disposed on the layer 12, on opposite sides of the elongated layer 14.

The front and rear surfaces 22 and 24 of the laser diode 10, including at least the front and rear exposed surfaces of the layers 12 and 14, are parallel to each other and perpendicular to the PN junction 16. The upper surfaces of the layers 14 and 20, and the lower surface of the layer 12 are metallized, as by suitable metal coatings 26 and 28, respectively, to provide electrical contacts to the laser diode 10. When a threshold current is caused to flow through the laser diode 10 in the forward biased direction, coherent light is emitted in the plane of the PN junction 16, as illustrated by dashed arrows 30 and 32.

Referring now to FIGS. 2–6, there are shown steps in one embodiment of the novel methods of making the improved laser diode 10. The layer 12, in FIG. 2, may be a monocrystalline wafer of either N type or P type GaAs. If the layer 12 is N type GaAS, as illustrated, it is doped with donor atoms, preferably Te (tellurium), in a concentration of about $4 \times 10^{18}$ cm.$^{-3}$, that is, the layer 12 should have a resistivity of about 0.0005 ohm-cm. Selenium (Se) and sulphur (S) may also be used as an N type dopant. The upper and lower major surfaces 13 and 15 of the layer 12 should be preferably in the (100) or (111) GaAS crystal plane to provide easy cleavage in a subsequent operation.

Dimensionally, the layer 12 may be about 6–10 mils thick, 10–15 mils wide, and about 50 mils long. The dimensions of the layer 12 illustrated in FIG. 2, as well as in the other figures herein, are not to scale, some of the dimensions being exaggerated to illustrate the features of the invention clearly.

The P type layer 14 (FIG. 3) may be formed epitaxially on the cleaned, lapped, polished, and etched major surface 13 of the layer 12 by any means known in the art. For example, a mixture of components in the proportions of 8 grams Ga (gallium), 1.8 grams GaAS, and about 0.5 grams Zn (zinc) is heated to a temperature between 910° C. and 950° C., at which it is molten, and then placed on the surface 13 of the layer 12 in a suitable container. Other suitable P type dopants, such as manganese (Mn), for example, may be used instead of Zn. The solution of the mixture is then allowed to cool to about 400° C. During this cooling period, a portion of the GaAS of the layer 12 is first dissolved and then the highly doped monocrystalline layer 14, of excellent crystalline quality, crystallizes out of the solution to replace the previously dissolved portion.

The upper surface 17 of the layer 14 is cleaned, lapped, polished, and etched by any suitable means known in the art. The layer 14 of P type GaAS deposited in the manner described has an acceptor concentration in the order of about $10^{19}$ cm.$^{-3}$, that is, the layer 14 has a resistivity of about 0.0001 ohm-cm.

Figure 3:
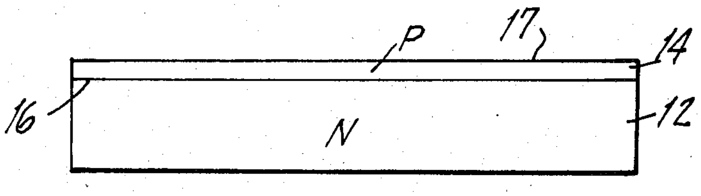
FIGS. 3–6 are front elevational views of semiconductor material showing steps in one embodiment of the novel methods of making the improved laser diodes.

The layer 14 forms the PN junction 16 with the layer 12, as shown in FIG. 3. To make an efficient laser diode 10, however, a post diffusion treatment may be desirable to interdiffuse the Zn dopant from the layer 14 into the layer 12. This is accomplished by heating the layers 12 and 14 between 900° C. and 975° C. for a period of between ½ and 4 hours.

Figure 4:
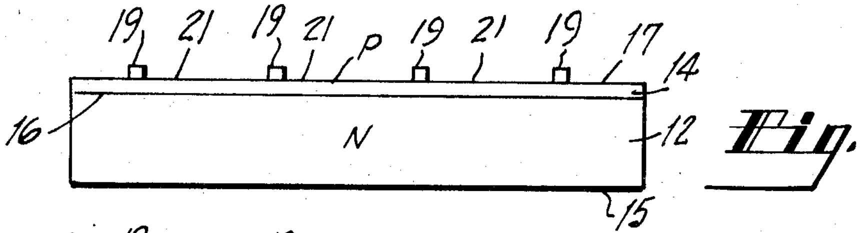

The upper major surface 17 of the layer 14 is lapped until the thickness of the layer 14 is about 2 mils, and a plurality of substantially parallel strips 19 of $SiO_2$ (silicon dioxide), extending from the front to the rear of the layer 14, are deposited on the lapped surface 17 of the layer 14, as shown in FIG. 4. The strips 19 of $SiO_2$ may be deposited by any suitable means known in the art, such as by vapor deposition from the reaction products of $SiH_4$ (silane) and $O_2$ (oxygen). Each of the parallel strips 19 may be 1 mil wide, .02 mil thick, and spaced about 5 mils from an adjacent strip 19. Portions 21 of the major surface 17, between adjacent pairs of strips 19, may be protected during the deposition of the silicon dioxide by either a removable photoresist or a suitable wax, operations well known in the art. The protective means are removed after the strips 19 of $SiO_2$ have been formed.

It is desired to dissolve portions 21 of the layer 14 of P type material, leaving only those portions of the layer 14 beneath the strips 19, and replacing the dissolved portions with semiconductor material of high resistivity. This can be accomplished by a solution regrowth operation. To this end, a mixture of components in the proportions of 8 grams Ga and 1.2 grams GaAS are heated to a temperature between 880° C. and 920° C., at which temperature the mixture forms a solution. The solution is then placed over the portions 21 and the strips 19 in a suitable container and allowed to cool to a temperature of about 400° C. A thermocouple thermometer (not shown) may be used to gage the temperature of the solution. (An appropriate impurity, such as iron (Fe), may also be added to the mixture for compensation purposes to form high resistivity regrowth material. Such a mixture will be described hereinafter.)

Figure 5:
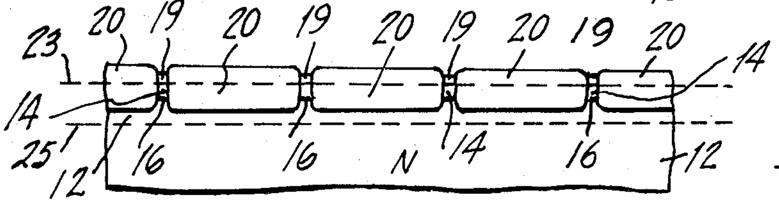

During this cooling period (920°–400° C.), GaAS is initially dissolved from the portions 21 and then recrystallized to form the high resistivity layers 20, as shown in FIG. 5. The molten solution does not affect the strips 19 of silicon dioxide. After the solution has reached a temperature of about 400° C., it is removed, leaving the layers 20 of intrinsic GaAS, that is, GaAS of a relatively high resistivity in the order of about 0.1 ohms-cm. The resistivity of the layers 20 is, therefore, at least one order of magnitude higher than that of either the layers 12 or 14. In the last operation, portions of the layer 14 beneath the portions 21 have been completely dissolved and regrown in the form of the high resistivity layers 20. The PN junction 16 between the layers 12 and 14, underneath the strip 19 is, therefore, formed substantially as narrow as the strip 19 and is elongated by the last operation.

The upper and lower surfaces of the structure shown in FIG. 5 are lapped, to the dashed lines 23 and 25, respectively, that is, until (1) the strips 19 are removed, (2) the layer 14 is about 1 mil thick, and (3) the layer 12 is about 2 mils thick directly beneath the PN junction 16.

Figure 6:
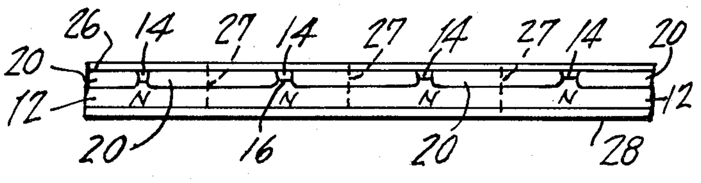

Next, the exposed surfaces of the layers 12, 14 and 20 are cleaned, etched, and metallized to provide the metallized coatings 26 and 28, as shown in FIGS. 6 and 1. This can be accomplished by evaporating Sn (tin) on the lapped upper surfaces of the layers 14 and 20, and then coating the tin coated surfaces, as well as the lapped lower surface of the layer 12, with nickel (Ni), as with an electrodeless Ni solution. The Ni coated surfaces may then be coated further with gold (Au), as with an electrodeless Au solution.

The improved laser diode 10 (FIG. 1) is obtained by cleaving the semiconductor device of FIG. 6 along (110) planes to obtain the parallel surfaces 22 and 24. The surfaces 22 and 24 may be spaced apart a distance of between 20 and 50 mils. Individual diodes 10 can be cleaved from the structure shown in FIG. 6 by cutting or breaking along the dashed lines 27 to form a plurality of the laser diodes 10. The opposite vertical sides 34 and 36 of the laser diode 10 should be roughened so that they do not function as mirrors.

The improved efficiency of operation of the laser diode 10 results from the relatively narrow PN junction 16, which may be formed with a width of about 0.1 mil, a dimension not easily obtainable by prior-art methods. Also, the thermal resistance of the diode 10 is reduced by providing the intrinsic layers 20, on opposite sides of the elongated layer 14, to function as heat sinks for dissipating heat. The relatively large layers 20 also provide the laser diode 10 with a rigid structure, a rigidity not easily obtainable by prior-art methods.

Figures 7, 8, 9, 10, 11, 12:
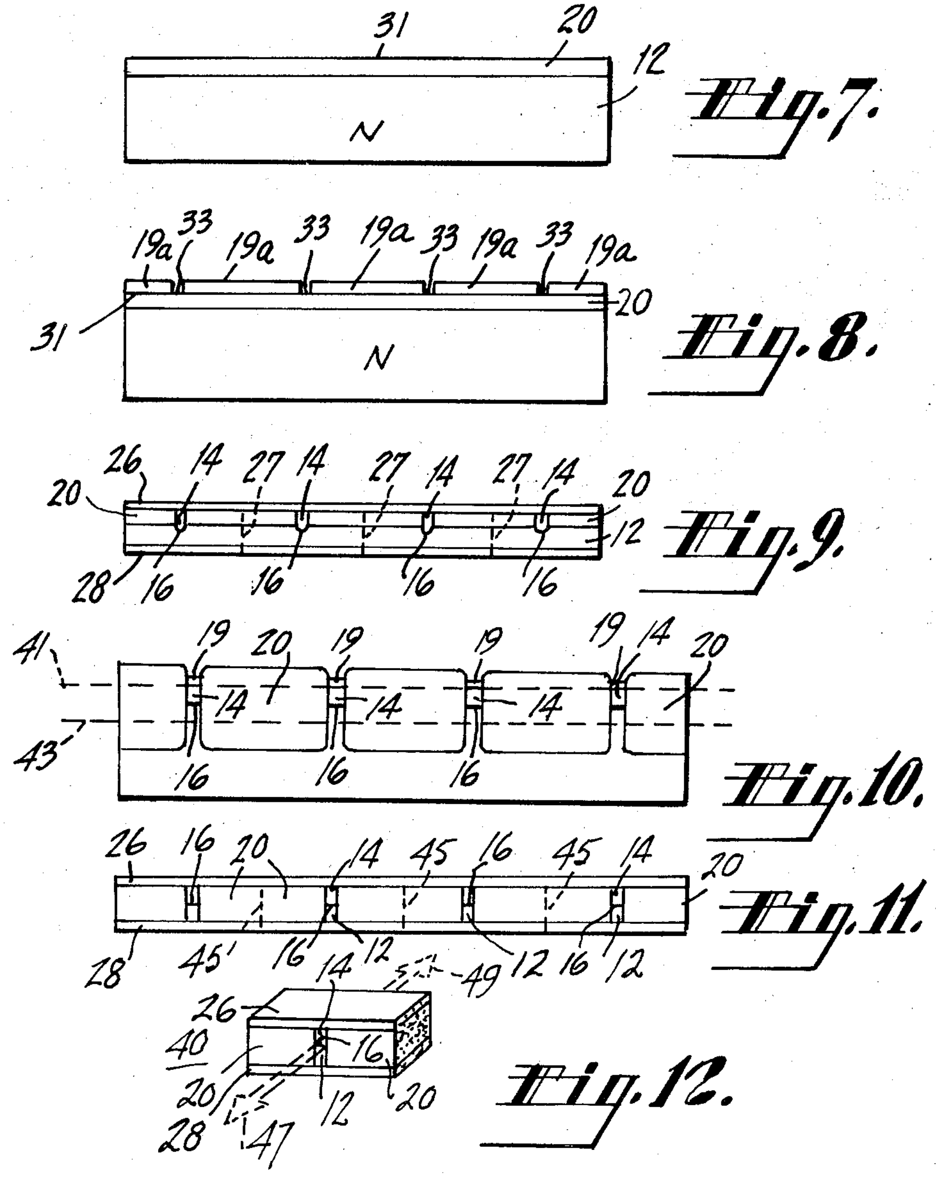
FIGS. 7–9 are front elevational views of semiconductor material showing steps in another embodiment of the novel methods of making the improved laser diodes.
FIGS. 10 and 11 are front elevational views of semiconductor material showing steps in still another embodiment of the novel methods of making the improved laser diodes.
FIG. 12 is a perspective view of an improved laser diode made by the operations illustrated in FIGS. 10 and 11.

Referring now to FIGS. 7–9, there are shown steps in another embodiment of the novel methods of making the improved laser 10. The layer 20 of high resistivity GaAs is first deposited on the layer 12 of N type GaAs, as shown in FIG. 7, and relatively wide strips of silicon dioxide **19*a* are deposited on the lapped, cleaned, polished, and etched upper surface 31 of the layer 20, as shown in FIG. 8. The parallel strips 19*a* of silicon dioxide may be spaced as little as 0.1 mil apart. Elongated layers 14 may now be formed in the exposed portions 33 of the layer 20, between adjacent strips 19*a* of $SiO_2$, by the solution regrowth of P type GaAs from the molten mixture as described for the deposition of the layer 14 on the layer 12. To provide the structure shown in FIG. 9, when lapped and metallized, the elongated layers 14 are grown to a depth below the junction formed by the layers 20 and 12 to form the PN junction 16. Laser diodes 10** may now be formed from the structure shown in FIG. 9 by suitable cleavage and separation operations as described for structure illustrated in FIG. 6.

Referring now to FIG. 12 of the drawings, there is shown an improved laser diode 40 wherein both the N type layer 12 and the P type layer 14 are elongated and the high resistivity layers 20 are disposed on the opposite sides of both of the layers 12 and 14. The PN junction 16 in the diode 40 can be made to substantially the same dimensions as those in the laser diode 10, illustrated in FIG. 1.

Referring now to FIGS. 10 and 11 of the drawings, there are shown steps in still another embodiment of the novel methods of making the improved laser diode 40. First, the P type layer 14 is formed on the N type layer 12, providing the PN junction 16 therebetween; and then a plurality of thin strips 19 of $SiO_2$ is deposited on the upper surface of the layer 14, as described for the formation of the structure shown in FIG. 4. The layers 20 are now formed by the solution regrowth operation in substantially the same manner described for the formation of the layers 20 in FIG. 5. Thus, the layers 20 may be formed by the solution regrowth operation from the molten mixture of Ga and GaAs in the proportions of 8 grams:1.2, respectively. Another mixture that may be substituted for the previously mentioned mixture is a mixture in the proportions of 2 grams GaAs, 7 grams Ga, and 0.030 Fe (iron). This latter mixture is molten and applied to the exposed surfaces of the layer 14 under substantially the same conditions as described for the former mixture of Ga and GaAs to provide the layers 20 of monocrystalline GaAs of a higher resistivity than that of either of the layers 12 or 14. The layers 20 formed by the solution regrowth technique, employing either the former or the latter-mentioned mixtures, provide monocrystalline layers whose resistivities are at least one order of magnitude, that is, ten times, greater than that of either of the layers 12 or 14. Layers 20 possessing resistivities that are three orders of magnitude greater than that of either of the layers 12 or 14 have also been formed by this technique.

To form the diode 40, the solution regrowth operation is allowed to continue until it acquires a thickness that extends below the PN junction 16, as shown in FIG. 10. The upper and lower surfaces of the structure shown in FIG. 10 are then lapped, polished, and etched, to the upper and lower dashed lines 41 and 43, respectively. The upper and lower surfaces of the etched structure are metallized by metal coatings 26 and 28 in substantially the same manner described for the metal coatings for the structure in FIG. 6. When the structure in FIG. 11 is suitably cleaved and separated, as by breaking along the dashed lines 45, in the manner previously described for the formation of the laser diodes 10, the improved laser diodes 40 are formed.

The improved laser diode 40 has substantially the same operating characteristics as that of the laser diode 10. When a source of voltage (not shown) is applied across the terminals 26 and 28 of the laser diode 40 so that a threshold current flows through the diode 40 in a forward biased direction, coherent light is emitted in the plane of the PN junction 16, as illustrated by the dashed arrows 47 and 49. The coherent light is in the infrared range, and its wavelength varies from about 8500 A. to about 9000 A. over a temperature between 77° K. to 300° K.

Although the effective portions responsible for the lasing of the improved laser diode 40 are the layers 12 and 14, the PN junction 16 formed by these layers can be made very small by the novel methods of manufacture, thereby reducing the thermal resistance, decreasing the threshold current through the PN junction required for lasing, and increasing the efficiency of the laser diode 40. Such a construction not only tends to decrease the area of heat formation in the PN junction, but any heat generated is dissipated effectively by the relatively large layers 20 of high resistivity. Because all of the layers 12, 14, and 20 are of monocrystalline GaAs, they have substantially the same coefficient of expansion and provide a rugged laser diode capable of withstanding relatively high threshold currents without creating internal thermal stresses.

What is claimed is:

1. A method of making a laser diode comprising the steps of:

providing a first layer of semiconductor material of a first resistivity, forming a second layer of semiconductor material of a second resistivity on said first layer to provide a junction therewith, providing spaced apart strips of silicon dioxide on a major surface of said second layer, whereby to expose portions of said second layer, dissolving said portions of said second layer to a depth of at least said junction with a molten mixture comprising Ga and GaAs, and depositing, by solution regrowth from said molten mixture, monocrystalline semiconductor material of a third resistivity in place of said portions dissolved.

2. A method of making a laser diode as described in claim 1, wherein said junction provided is a PN junction, and said semiconductor material of a third resistivity has a resistivity of at least an order of magnitude greater than that of either said first resistivity or said second resistivity.

3. A method of making a laser diode as described in claim 1, wherein portions of said semiconductor material of said third resistivity form a PN junction with said first layer, and said second resistivity is at least ten times as high as that of either said first resistivity or said second resistivity.

4. A method of making a laser diode as described in claim 1, wherein said mixture comprises Fe in addition to Ga and GaAs.

5. A method of making a laser diode as described in claim 1, wherein said mixture comprises components in the ratio of 2 grams GaAs, 7 grams Ga, and 0.03 gram Fe.

6. A method of making a laser diode comprising the steps of:

providing a first layer of GaAs of a first resistivity, growing, by solution regrowth, from a molten mixture comprising Ga and GaAs, a second layer of GaAs of a second resistivity on said first layer and forming a junction therewith, forming spaced apart strips of silicon dioxide on a major surface of said second layer, whereby to expose portions of said second layer, and growing, by solution regrowth, from a molten mixture, comprising Ga and GaAs, monocrystalline semiconductor material of a third resistivity in said exposed portions to a depth extending below said junction, whereby to leave said junction only beneath those portions of said second layer having said strips thereon.

7. A method of making a laser diode as described in claim 6, wherein said first and said second layers are GaAs of opposite type conductivities, said junction is a PN junction, and said third resistivity is at least an order of magnitude higher than that of either said first or said second resistivities.

References Cited

UNITED STATES PATENTS

| | | | |
|---|---|---|---|
| 3,272,669 | 9/1966 | Im | 148—179 |
| 3,341,754 | 9/1967 | Kellett | 148—1.5 |
| 3,351,502 | 11/1967 | Rediker | 148—177 |
| 3,355,335 | 11/1967 | Butler | 148—177 |

OTHER REFERENCES

Nelson: "RCA Review," December 1963, pp. 603–15.

Rupprecht: "Proc. of the 1966 Symposium on GaAs in Reading," ed. Inst. of Phys. and Physical Soc., pp. 57–61.

CARL D. QUARFORTH, Primary Examiner

B. H. HUNT, Assistant Examiner

U.S. Cl. X.R.

148—172, 177; 317—235 R